United States Patent [19]

Spiesman et al.

[11] Patent Number: 4,847,831
[45] Date of Patent: Jul. 11, 1989

[54] BIDIRECTIONAL REPEATER FOR MANCHESTER ENCODED DATA SIGNALS

[75] Inventors: Robert L. Spiesman; Tony J. Kozlik, both of Phoenix, Ariz.

[73] Assignee: Honeywell Inc., Minneapolis, Minn.

[21] Appl. No.: 31,965

[22] Filed: Mar. 30, 1987

[51] Int. Cl.[4] .............................................. H04L 5/14
[52] U.S. Cl. ........................................ 370/97; 375/4; 455/601
[58] Field of Search ............... 370/97, 4; 375/3, 4, 375/55; 455/601, 600, 606, 607, 608, 612

[56] References Cited

U.S. PATENT DOCUMENTS

| | | | |
|---|---|---|---|
| 4,257,125 | 3/1981 | Theall, Jr. | 375/55 |
| 4,259,746 | 3/1981 | Sandstedt | 455/600 |
| 4,408,353 | 10/1983 | Bowen et al. | 455/601 |
| 4,562,582 | 12/1985 | Tokura et al. | 375/55 |
| 4,607,256 | 8/1986 | Henzel | 340/825.92 |
| 4,631,695 | 12/1986 | Kozlik | 364/715 |
| 4,631,733 | 12/1986 | Spiesman | 375/7 |
| 4,700,342 | 10/1987 | Egami | 370/97 |

Primary Examiner—Douglas W. Olms
Assistant Examiner—Melvin Marcelo
Attorney, Agent, or Firm—A. A. Sapelli; D. J. Lenkszus; A. Medved

[57] ABSTRACT

A bidirectional repeater for Manchester encoded data (MED) signals present on a coaxial cable and fiber optic cable forming the transmission media of a local area network. The repeater receives and then reconstitutes the MED signals present on the coaxial cable and transmits the reconstituted MED signals onto the fiber optic cable. MED data present on the fiber optic cable is received, reconstituted, and transmitted onto the coaxial cable. Signals can be received from only one cable at any one time. Transmission of reconstituted MED signals is terminated when a special set of MED signals identifying the end of a transmission by a module of the network is received.

9 Claims, 2 Drawing Sheets

BIDIRECTIONAL REPEATER FOR MANCHESTER ENCODED DATA SIGNALS

CROSS-REFERENCE TO RELATED APPLICATIONS

The following co-pending concurrently filed application relates to the invention of the present application and is incorporated herein by reference:

Receive Manchester Clock Circuit by R. L. Spiesman and B. B. Baumann, application Ser. No. 07/031,957, filed Mar. 30, 1987.

The above identified application and this application are both assigned to Honeywell Inc., a Delaware Corporation.

BACKGROUND OF THE INVENTION

1. Field of the Invention

This invention is in the field of bidirectional repeaters of digital data signals present or carried by the communication media of a token passing local area network. More particularly, this invention is in the field of repeaters which receive Manchester encoded data (MED) signals present on one portion of the media, reconstitute the received MED signals and transmit the reconstituted MED signals onto a second portion media, and vice-versa.

2. Description of Related Art

A Plant Management System such as described and claimed in U.S. Pat. No. 4,607,256 which issued to R. A. Henzel on Aug. 19, 1986 is a token-passing control network having a plurality of modules which communicate with one another over dually redundant high speed bit serial communication buses. In the preferred embodiment, information is transmitted between modules of the network as frames, a token passing frame which is also called a token, or an information frame. Each type of frame includes a preamble which includes a plurality of bytes, from eight to ten in the Henzel system, of signals of the same type such as logical ones, a start of frame delimiter (SFD) of one byte, and an end of frame delimiter (EFD) also of one byte.

Information transmitted by a module of the network and thus present on the media is embodied in a frame and consists of binary signals which are Manchester encoded so that a receive Manchester clock can be derived from the signals received by each receiving module of the network. In the preferred embodiment a logical zero is transmitted by the signal voltage level being low initially, or during the first half of a bit cell, and being high during the second half of the bit cell, a mid bit low to high transition. A logical one is transmitted by the signal voltage level initially during the first half of the Manchester bit cell being high and being low during the second half, a mid bit high to low transition. Manchester encoding requires that there always be a transition in the middle of each Manchester bit cell. If there is no such transition, a code violation (CV) occurs. Both start and end of frame delimiters include code violations, four CV's each. An end of frame delimiter (EFD) is used rather than silence on the communication media to avoid the possibility that reflections of signals on the media would be interpreted as a transmission after a module having the token stops transmitting. The length of the communication media, coaxial cable in Henzel's system, was limited to substantially 300 meters because of attenuation and distortion of the MED signals present on the cable which attenuation and distortion increase as a function of the length of the coaxial cable of the communication media of the network. The length of such a cable is thus limited to that at which data errors caused by the attenuation and distortion associated with the media are minimized, approaching zero as a limit.

In certain plant environments there is a requirement that modules of a given plant control network be located at distances from one another such that the length of the connecting communication cables, or media, connecting the modules of a network exceed the length over which the MED signals can be transmitted reliably. There, thus, is a need to extend the length of the communication media of such a local area network without introducing data errors in the MED signals transmitted or carried by the network media.

PRIOR ART STATEMENT The following references are submitted under the provisions of 37 CFR 1.97(b).

Patent: U.S. Pat. No. 4,607,256, dated Aug. 19, 1986 by R. A. Henzel.

Patent: U.S. Pat. No. 4,631,733, dated Dec. 23, 1986 by Robert L. Spiesman.

Patent: U.S. Pat. No. 4,631,695, dated Dec. 23, 1986 by Tony J. Kozlik.

Henzel discloses a token-passing network of a plant management system in which the bidirectional repeater of this invention can be used.

Spiesman teaches a transceiver which can receive or transmit Manchester encoded data signals from or onto a coaxial cable of the Henzel network.

Kozlik discloses a detector of predetermined patterns of Manchester encoded data signals such as an end of frame delimiter (EFD).

SUMMARY OF THE INVENTION

The present invention provides a bidirectional repeater of Manchester encoded data, MED, signals which are carried, or present, on two different types of communication media of a token passing local area network. The two types of media in the preferred embodiment are a coaxial cable and a fiber optic cable. MED signals present on either type, for example the coaxial cable, are initially amplified and squared to eliminate some of the distortions they have incurred due to the length of the cable. The received signals are applied to a coax detector which produces a coax control signal as long as the MED signals are present on the coaxial cable. The coax control signal disables a fiber optic (OF) detector associated with the fiber optic cable. The coax control signals also enable the received MED signals from the coax cable as amplified and squared to be applied to a receive Manchester clock circuit which produces as its output receive Manchester clock signals with two such clock signals or pulses being produced for each Manchester bit cell received, or at double the basic frequency of the MED signals. The receive Manchester clock is used to synchronize the output of a phase locked loop oscillator with the received MED signals. The clock signals produced by the phase locked loop oscillator hereafter referred to as the reconstituted Manchester clock and the received MED signals are applied to a D-type flip-flop which functions as a modulator to produce reconstituted MED signals having the same informational content as the received MED signals. The reconstituted MED signals are applied to the fiber optic transmitter of this invention. The fiber optic (OF) transmitter is enabled by the coax control signal and a sync delay signal produced by a sync delay counter after a predetermined number of MED signals of the preamble of a frame of MED signals are received. Transmission by the FO transmitter is terminated when an end of frame delimiter is detected by an end of frame detector. Similarly, MED signals present on the fiber optic cable are reconstituted and transmitted onto the coaxial cable.

At the present time it is not possible to connect modules of a control network into a fiber optic cable. As a result, if more than one module is to be located at the remote end of a fiber optic cable, then another bidirectional repeater must be used to receive MED signals from the FO cable reconstitute them and transmit the reconstituted MED signals onto a second coaxial cable. The maximum length of a fiber optic cable with present cost effective state of the art fiber optic cables and OF transmitters and receivers is substantially two kilometers. With the use of multiple repeaters, it is possible to extend the length of the network's communication media essentially indefinitely. The practical limitation on the maximum length is that the more repeaters through which the MED signals must pass, the longer the preamble of each frame.

It is therefore an object of this invention to provide a bidirectional repeater for a token passing local area network which extends the effective length of the network's communication media.

It is yet another object of this invention to provide a bidirectional repeater for a token passing local area network which reconstitutes MED signals received from one link of the communication media of the network and transmits the reconstituted MED signals onto a second link of the communication media.

It is still another object of this invention to provide a bidirectional repeater for a token passing local area network which produces reconstituted Manchester clock signals which are synchronized and substantially in phase with receive Manchester clock signals derived from received MED signals, received from one of two links of the communication media and which produces reconstituted MED signals from which pulse width distortion has been substantially eliminated and transmits the reconstituted MED signals onto the other link of the communication media.

BRIEF DESCRIPTION OF THE DRAWINGS

Other objects, features and advantages of the will be readily apparent from the following description of the preferred embodiment thereof taken in conjunction with the accompanying drawing although variations and modifications may be effected without departing from the spirit and scope of the novel concept of the invention, and in which the sole FIG. (1A+1B combined) is a schematic block diagram of the bidirectional repeater of this invention.

DESCRIPTION OF THE INVENTION

Figure 1A:
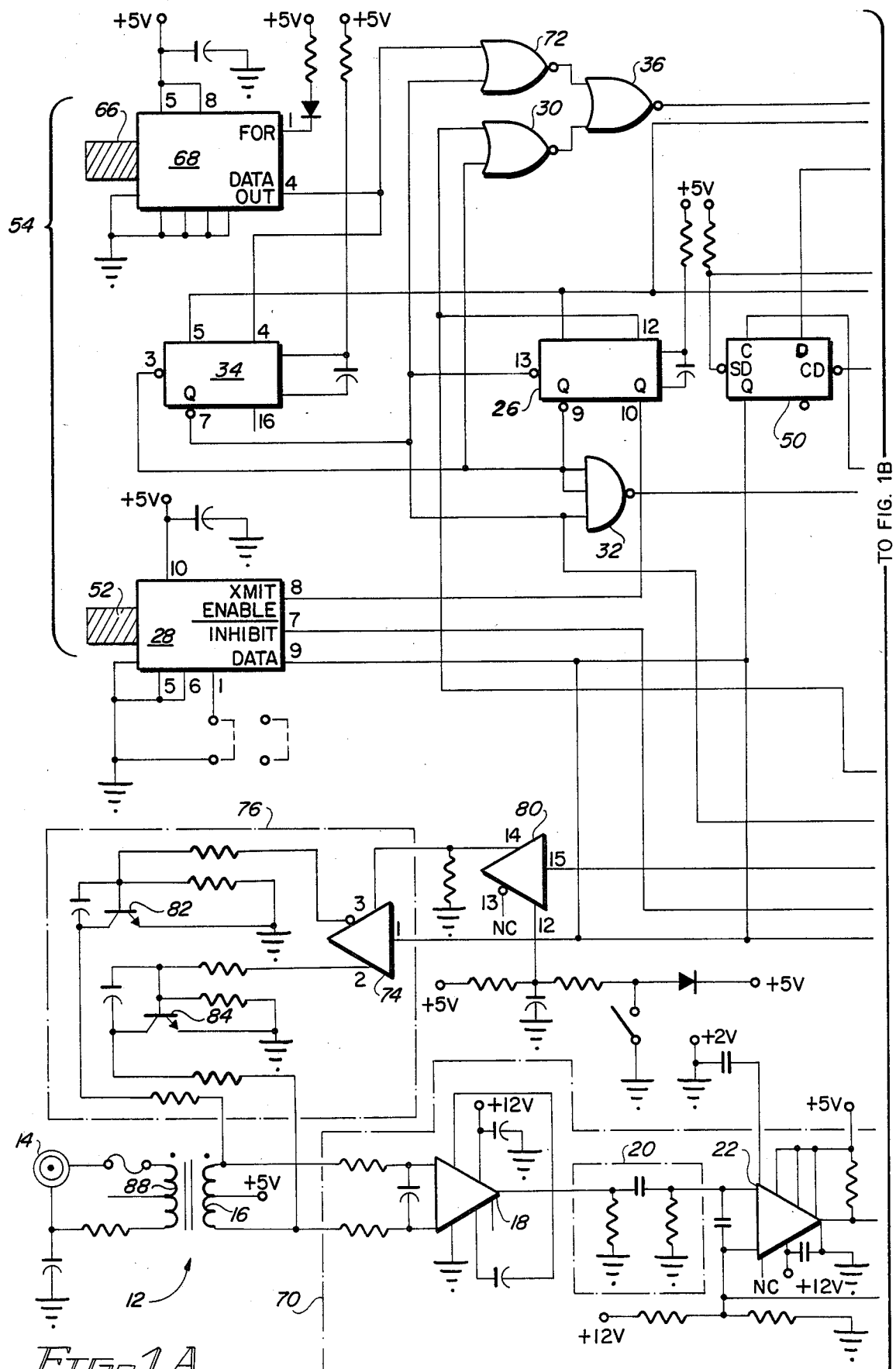
Figure 1B:
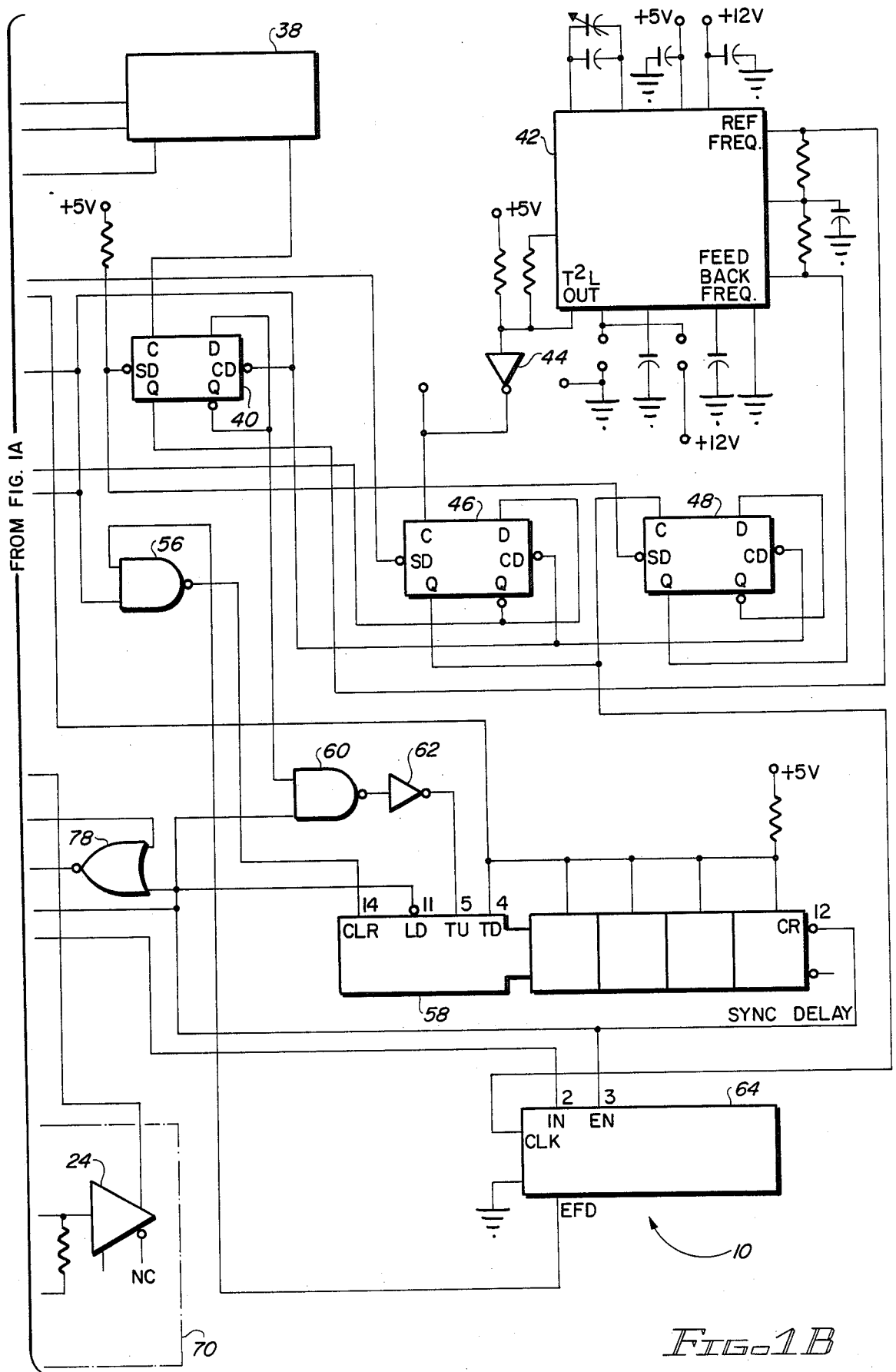

In the drawing, bidirectional repeater 10 is operationally connected by coupling transformer 12 to coaxial cable 14. Transmission line 14, in the preferred embodiment, carries, or has applied to it, or has present on it, two signals, a Manchester encoded 5.0 MHz substantially square wave data signal having a 50% duty cycle, hereafter referred to as Manchester encoded data (MED) signals and a 12.5 kHz quasi- or pseudo- sinusoidal timing signals. Signals present on transmission line 14 induce voltages across winding 16 of coupling transformer 12. The signals across windings 16 are applied to input terminals of very high frequency differential amplifier 18 which amplifies the composite signals present. The output of differential amplifier 18 passes through high pass R.C. filter 20 which removes the 12.5 kHz timing signals. The 5.0 MHz MED signals out of filter 20 are applied to a very high speed voltage comparator 22. The 5.0 MHz MED signals applied to comparator 22 may not be square waves because the higher frequency components of square wave signals are attenuated more rapidly by a transmission line. Comparator 22 squares the 5.0 MHz MED signals so that their wave form is once again that of a square wave with pulse widths of substantially 100±10 nanoseconds in the preferred embodiment. The output of comparator 22 is applied to buffer amplifier, or driver, 24. The output of driver 24 is applied to the Schmitt trigger input terminal of monostable multivibrator 26.

Monostable multivibrator 26 functions as a detector of 5.0 MHz MED signals present on coaxial cable 14. When such signals are present in the signal applied to pin 12 of multivibrator 26, the Q output at pin 10 of circuit 26 goes HIGH and $\overline{Q}$ at pin 9 goes LOW. A second trigger input within the timing cycle of multivibrator 26 will result in the Q signal remaining HIGH or of multivibrator 26 not changing state. In the preferred embodiment a second positive going trigger applied to pin 12 within 600$\mu$ sec. will cause the Q output of multivibrator 26 to remain HIGH and prevent device 26 from changing state. The two outputs of device 26, Q and $\overline{Q}$, are used as coax control signals. The Q output is applied to the transmit enable terminal of fiber optic transmitter (FOT) module 28 which enables FOT 28 to transmit optical signals produced by an LED at power levels determined by the voltage levels of the signals applied to the data-in terminal pin 9 of FOT 28. The $\overline{Q}$ output of multivibrator 26 is applied to one input terminal of NOR gate 30, to two input terminals of three input NAND gate 32, and to the direct clear input pin 3 of monostable multivibrator detector 34. The $\overline{Q}$ output of device 26 when LOW enables NOR gate 30 and disables device 34 maintaining device 34's $\overline{Q}$ output HIGH.

The output of buffer amplifier 24, the amplified and squared MED signals present on cable 14, are also applied to the second input terminal of NOR gate 30 which is enabled by the LOW $\overline{Q}$ control signal produced by detector 26. The MED signal applied to NOR gate 30 passes through NOR gate 36 to Manchester code receive clock circuit 38. For additional information with respect to the structure and function of receive clock circuit 38 reference is made to the co-pending concurrently filed patent application entitled "Receive Manchester Clock Circuit" further identified in the section of this application entitled Cross Reference to Related Applications. The output of circuit 38 are received Manchester clock signals consisting of positive pulses of a given pulse width at twice the 5.0 MHz frequency of the MED signals and which clock signals are synchronized, or in phase, with the received MED signals applied to circuit 38. The output of circuit 38 is applied to D-type positive edge triggered flip-flop 40 which divides the receive clock pulses applied to its clock input terminal by two. The 5 MHz square wave output signals at the Q terminal of flip flop 40 which have a 50% duty cycle are applied to the reference frequency input terminal of phase locked loop oscillator 42. The free running frequency of the phase locked loop oscillator 42 at its TTL output terminal is set at 20 MHz, four times the frequency of the received MED signals. The output of the phase locked loop oscillator 42 is inverted by inverter amplifier 44 and applied to the clock input terminal of D-type positive edge triggered flip flop 46. The Q output of flip flop 46 is applied to the clock input of D-type positive edge triggered flip flop 48. The Q output of flip flop 48 is applied to the feed back input terminal of phase locked loop oscillator 42. The function of flip flops 46 and 48 is to divide the frequency of the output signals of phase lock loop oscillator 42 by four. The divided signal, in the preferred embodiment, is a 5 MHz signal which is used as the feed back signal to phase locked loop oscillator 42. After a few cycles, sixteen in the preferred embodiment, the output signals of phase locked loop oscillator 42 are in phase with the signals applied to its reference frequency terminal. Any variations in the period of, or frequency of, the receive Manchester clock will be substantially eliminated; or stated another way, the reconstituted Manchester clock signal at the $\overline{Q}$ output of flip flop 46 will satisfy the system requirements for such signals in the network.

The $\overline{Q}$ output of flip flop 46 at a frequency of 10 MHz is the reconstituted Manchester clock signal, and is applied to the clock input terminal of D-type positive edge triggered flip flop 50. The output of NOR gate 36, the received Manchester encoded data signals present on coaxial cable 14, in the present example, are applied to the D input terminal of flip flop 50. The reconstituted Manchester clock signal is applied to the clock input terminal of flip flop 50 with the positive edge of the reconstituted Manchester clock signal coming substantially in the middle of each half bit cell of a received Manchester bit cell applied to the D input terminal of flip flop 50. The Q output of flip flop 50 is the reconstituted MED signals. In this application flip flop 50 functions as a mixer, or modulator. The reconstituted MED signals at the Q output of modulator 50 are applied to the data in terminal of FOT 28. However, transmitter 28 will not transmit these signals onto fiber optic filament 52 of fiber optic cable 54 until a HIGH signal is present at its transmit enable input terminal, pin 8, and a LOW signal is applied to its INHIBIT-NOT terminal, pin 7.

The coaxial control signal produced at the $\overline{Q}$ output of monostable multivibrator 26 which is LOW when MED signals are present on or being received from coaxial cable 14 are applied to two inputs of three input NAND gate 32. When $\overline{Q}$ of device 26 goes LOW, the output of gate 32 goes HIGH. The output of gate 32 is one input to NAND gate 56. Since the other input to gate 56 is also normally HIGH as will be explained below, the output of gate 56 goes LOW. The output of gate 56 is applied to the clear, or master reset, terminal of binary counter 58 which when LOW enables counter 58 to begin counting pulses present at the $\overline{Q}$ output of flip flop 40 having a frequency of the MED signals, or 5 MHz, and having a 50% duty cycle; or stated another way, being substantially squared. The $\overline{Q}$ output of flip flop 40 is one input to two input NAND gate 60. The other input to NAND gate 60 is the sync delay signal from the terminal identified as count up output CR at pin 12 of counter 58 which is normally HIGH and thus enables gate 60. The output of gate 60 is inverted by inverter 62, and the output of inverter 62 is applied to the count up clock input terminal of counter 58. When 16 pulses representing 16 Manchester encoded bit cells are applied to counter 58 after counter 58 is enabled by the output of gate 56 going low, the sync delay signal at pin 12 of counter 12 goes LOW. When the sync delay signal goes LOW it disables NAND gate 60 so that no more clock signals are applied to the count up clock input terminal of counter 58 and the sync delay signal will stay HIGH until a HIGH signal is applied to its clear terminal from gate 56. As a result, no more clock signals are applied to counter 58. It should be noted that the sync delay signal is also applied to the inhibit terminal of FOT 28, and when the sync delay signal goes LOW it enables transmitter 28. Concurrently the coaxial control signal at the Q output of detector 26 is HIGH which enables FOT 28 to transmit reconstituted MED signals applied to its data in terminal, pin 9, and apply them to the transmit filament 52 of OF cable 54. The function of sync delay counter 58 is to delay enabling the transmission of the reconstituted MED data signals until phase locked loop oscillator 42 has had time to become synchronized with the signals applied to its reference frequency input terminal. After sixteen MED signals have been received, or 3.2µ sec. has elapsed since MED signals were first detected by detector 26, PLL 42 will be synchronized with the receive Manchester clock signals produced by receive Manchester clock synthesizer 38.

The reconstituted MED signals at the Q output of modulator 50 are also applied to the data in terminal of the end of frame delimiter detector 64, a programmable logic array device. Detector 64 is programmed to detect a predetermined pattern of values corresponding to the voltage level of half bit cells of a given sequence of Manchester bit cells some of which represent code violations. The particular pattern detected by detector 64 is that of an end of frame delimiter (EFD) used to identify the end, or termination, of each frame of Manchester encoded data signals transmitted by the module of the network having the token. Details of the structure and function of a more complex detector and which discloses the form of an end of frame delimiter is found in U.S. Pat. No. 4,631,695. Detector 64 is enabled when the sync delay signal produced by counter 58 goes LOW. Reconstituted Manchester clock signals present at the Q output of flip flop 46 are applied to the clock terminal of detector 64. When the set of signals of an end of frame detector are applied by modulator 50 to the data in terminal of detector 64, the end of frame detector output signal goes LOW. This EFD signal is one of the input signals to NAND gate 56, and when it goes LOW, the output signal of gate 56 goes HIGH clearing counter 58 so that the sync delay signal produced by counter 58 goes HIGH which terminates the operation of FOT 28. If no positive going trigger signal is applied to pin 12 of multivibrator 26, for a predetermined period of time, multivibrator 26 changes state with its Q output going LOW and its $\overline{Q}$ going HIGH. When the Q output of MV 26, the coax detector is LOW, FOT 28 is inhibited from transmitting. When the $\overline{Q}$ output of coax detector 26 is high, it enables gate 32.

If optical signals are present on fiber optic receive filament 66, which signals are the optical analogs of MED voltage signals when present on coaxial cable 14, fiber optic receiver (FOR) module 68 will produce amplified and squared electrical output signals at its data output terminal pin 4 which are the electrical analog of the MED optical signals present on receive optical filament 66 of fiber optic cable 54. The output signal of receiver 68 is the equivalent of output signal produced by buffer amplifier 24 of the coaxial receiver amplifier and squaring circuit 70. When MED signals are present on receive filament 56, the received MED signals at data out terminal, pin 4, are applied to the Schmitt Trigger input, pin 4, of retriggerable resettable monostable multivibrator 34. The positive going pulses of the received optical MED signals will set circuit 34, causing its $\overline{Q}$ output to go LOW. The $\overline{Q}$ output of circuit 34 is applied the clear direct terminal CD of circuit 26 and to one terminal of NOR gate 72. The $\overline{Q}$ output of MV 34 is the fiber optic (OF) control signal which when LOW denotes that fiber optic MED signals are present on receive FO filament 66 of FO cable 54.

When $\overline{Q}$ of circuit 34 goes LOW, it enables the received MED signals at the data out terminal of FO receiver 68 to be the output signal of NOR gate 72 and of NOR gate 36 and thus the received MED signals applied to receive Manchester clock circuit 38. Circuit 38 produces a receive Manchester clock which is applied to D flip flop 40. The $\overline{Q}$ output of FO receiver detector 34 is applied to NAND gate 32 which, when it goes LOW, causes the output of NAND gate 32 to go HIGH which in turn causes the output of NAND gate 56 to go LOW, permitting counter 58 to begin counting the output signals produced by flip flop 40 at the rate of 5 MHz in the preferred embodiment. The operation and function of phase locked loop oscillator 42, counter 58, and EFD detector 64 are the same as with respect to received OF MED signals as they are with respect to received coax MED signals received from cable 14 as described above.

When MED signals are present, or are received from fiber optic cable 54, it is necessary to transmit the reconstituted MED signals present at the Q output terminal of modulator 50 onto coaxial cable 14. To do this the reconstituted MED signals are applied to the input terminal, pin 1, of line driver 74 of coax transmitter 76. To enable driver 74 the sync delay signal produced by counter 58 and the FO control signal produced by FO detector 34 are applied to two input NOR gates 78. When the inputs to gate 78 are both LOW, its output is HIGH. The output of gate 78 is applied to the input terminal pin 15 of line driver 80. The output of line driver 80 at pin 14 is applied to the control input terminal, pin 4, of line driver 74. Thus, when the two inputs to gate 78 are LOW, line driver 74 is enabled and the reconstituted MED signals applied to its input terminal pin 1 determine the values of the two outputs of line driver 74. These two outputs are applied respectively to the bases of npn transistors 82, 84 to control the flow of current through winding 16 of coupling transformer 12. This induces, or develops, voltages across winding 88 of coupling transformer 12 to drive or to apply a bipolar square wave onto coaxial cable 14 corresponding to the reconstituted MED signals applied to line driver 74. For a more complete description of the operation of coax transmitter 76 reference is made to U.S. Pat. No. 4,631,733.

When MED signals are no longer sensed or detected by multivibrator 34, the FO control signal of the $\overline{Q}$ output terminal of detector 34 goes HIGH, or when an end of frame delimiter is detected by end of frame delimiter detector 64 and the EFD out signal goes LOW, the output of gate 56 goes HIGH which clears counter 58. When counter 58 is cleared its sync delay signal goes HIGH disabling EFD detector 64 and causing the output of gate 78 to go LOW disabling transmitter 76. This sets the conditions of repeater 10 so that it is prepared to receive MED signals from either cable 14 or coaxial cable 54 and to transmit the reconstituted MED signals produced by it onto the other cable or link of the transmission media.

In the preferred embodiment of the significant components of repeater 10 are:

|  | Type | Source |
|---|---|---|
| differential video amplifier 18 | LM 733 | National Semiconductor |
| high speed differential comparator 22 | LM 36 1 | National Semiconductor |
| Tri State Line Driver 24, 74, 80 | DS 3487 | Motorola Inc. |
| duel retriggerable resettable monostable multivibrator 26, 34 | 96 S02 | Fairchild Semiconductor |
| fiber optic transmitter module 28 | HFM 2010 | Honeywell Inc. |
| 2-input NOR gate 30, 36, 72, 78 | 74 F02 | Fairchild |
| 3-input NAND gate 32, 56 | 74 F10 | Fairchild |
| D-type positive edge triggered F/F 40, 46, 48, 50 | 74 F74 | Fairchild |
| phase locked loop oscillator 42 | /NE 564 | Signetics |
| inverter amplifier 44, 62 | F 04 | Fairchild |
| up/down binary counter 58 | LS 193 | National Semiconductor |
| 2-input NAND gate 60 | F00 | Fairchild |
| programmable logic array 64 | PAL R8B-2 | Monolithic Memory Inc./ Texas Inst. |
| fiber optic receiver 68 | HFM 1010 | Honeywell Inc. |
| EFD Detector 64 | PLA-64 | Monolithic Memory Inc./ Texas Inst. |

While the invention has been described with reference to illustrative embodiments, the description is for illustrative purposes and is not to be construed as limiting the scope of the invention. Various modifications and changes may occur to those skilled in the art without departing from the true spirit and scope of the invention as defined by the claims hereof.

What is claimed is:

1. A bidirectional repeater for Manchester encoded data (MED) signals present on a first and a second communication media of a token passing local area network, comprising:

first receiving means connected to the first media for amplifying and squaring MED signals present on the first media to produce a first output signal;

second receiving means connected to the second media for amplifying and squaring MED signals present on the second media to produce a second output signal;

first detector means operatively connected to the first receiving means for detecting the presence of the first output signal and to produce a first control signal;

second detector means operatively connected to the second receiving means for detecting the presence of second output signal and to produce a second control signal;

means for producing reconstituted MED signals from applied first output signal or from applied second output signal;

gate means to which the first and second output signals and first and second control signals are applied for applying the first output signal to the means for producing reconstituted MED signals when the gate means is enabled by the presence of the first control signal and for applying the second output signal to the means for producing reconstituted MED signals when the gate means is enabled by the presence of the second control signal; and first media transmitting means operatively coupled to the first media and second media transmitting means operatively connected to the second media, both the first and the second media transmitting means receiving the reconstructed MED signals, said first media transmitting means being enabled to transmit by the second control signal and said second media transmitting means being enabled to transmit by the first control signal.

2. A bidirectional repeater as defined in claim 1 in which the first communication media is a coaxial cable and the second communication media is a fiber optic cable.

3. A bidirectional repeater as defined in claim 2 which further comprises means for delaying enablement of the first and second media transmitting means for a predetermined period of time after the first or second detector means detects the production of an output signal by the first or second receiving means.

4. A bidirectional repeater as defined in claim 3 which further comprises means for terminating transmission by the first and second media transmitting means upon the first and second receiving means receiving a predetermined set of MED signals.

5. A bidirectional repeater as defined in claim 4 which further comprises means responsive to the production of the first control signal for inhibiting the second detector from producing the second control signal and means responsive to the production of the second control signal for inhibiting the first detector means from producing the first control signal.

6. A bidirectional repeater for Manchester Encoded Data (MED) signals present on a first and a second portion of a communication media of a token passing local area network comprising:

first means connected to the first portion for amplifying and squaring first received MED signals present on the first portion of the communication media;

second means connected to the second portion for amplifying and squaring second received MED signals present on the second portion of the communication media;

third means connected to the first means for sensing the presence of first MED signals amplified and squared by the first means and for producing a first control signal;

fourth means connected to the second means for sensing the presence of second MED signals amplified and squared by the second means and for producing a second control signal;

said first control signals disabling the fourth means from producing the second control signal and said second control signal disabling the third means from producing the first control signal;

fifth means for producing receive Manchester Clock signals from the MED signals applied thereto;

sixth means enabled by the first control signal for applying the MED signals from the first means to the fifth means, and enabled by the second control signal for applying the MED signal from the second means to the fifth means;

seventh means to which the signals produced by the fifth means are applied for producing a reconstituted Manchester Clock signal synchronized with the receive Manchester clock signal produced by the fifth means;

eighth means to which the reconstituted Manchester Clock signal and the MED signals applied to the fifth means by the sixth means are applied for producing reconstitued MED signals;

ninth means for transmitting the reconstituted MED signals onto the first communication media;

tenth means for transmitting the reconstituted MED signals onto the second communication media; and eleventh means for applying reconstructed MED signals to the ninth and tenth means, said ninth means being enabled to transmit when said second control signal is produced and said tenth means being enabled to transmit when the first control signal is produced.

7. A bidirectional repeater as defined in claim 6 in which the first portion of the communication media is a coaxial cable and the second portion of the communication media is a fiber optic cable.

8. A bidirectional repeater as defined in claim 7 which further includes twelfth means for delaying the ninth and tenth means from transmitting reconstituted MED signals for a predetermined delay period beginning when the first or second control signals ar produced.

9. A bidirectional repeater as defined in claim 8 which further includes thirteenth means for detecting a predetermined pattern of received MED signals and for terminating transmission by the ninth and tenth means upon said pattern being detected.

* * * * *